United States Patent [19]

Chen

[11] Patent Number: 5,773,991
[45] Date of Patent: Jun. 30, 1998

[54] MOTOR CURRENT SENSE CIRCUIT USING H BRIDGE CIRCUITS

[75] Inventor: Ching-Siang Chen, Laguna Niguel, Calif.

[73] Assignee: Texas Instruments Incorporated, Dallas, Tex.

[21] Appl. No.: 801,441

[22] Filed: Feb. 18, 1997

Related U.S. Application Data

[63] Continuation of Ser. No. 433,236, May 2, 1995, abandoned.

[51] Int. Cl.[6] ............................................. G01R 23/00
[52] U.S. Cl. ........................................................ 324/772
[58] Field of Search .................................... 324/772, 713, 324/545, 546; 318/490, 254, 138, 439; 360/73.01; 361/23, 30; 364/814, 550.01; 340/653

[56] References Cited

U.S. PATENT DOCUMENTS

| | | | |
|---|---|---|---|
| 4,146,801 | 3/1979 | Vali et al. ................................ | 361/33 |
| 4,203,058 | 5/1980 | Chen ....................................... | 318/380 |
| 4,633,358 | 12/1986 | Nagano ................................... | 361/33 |
| 4,673,852 | 6/1987 | Geiger .................................... | 318/341 |
| 4,860,152 | 8/1989 | Osborn .................................... | 361/91 |
| 5,081,404 | 1/1992 | Kelley et al. ........................... | 318/434 |
| 5,128,598 | 7/1992 | Avitan .................................... | 318/587 |
| 5,159,516 | 10/1992 | Fujihira .................................. | 361/18 |
| 5,194,786 | 3/1993 | Smith et al. ............................ | 318/254 |
| 5,204,593 | 4/1993 | Ueki ....................................... | 318/254 |
| 5,204,594 | 4/1993 | Carobolante ........................... | 318/254 |
| 5,210,475 | 5/1993 | Juzswik et al. ........................ | 318/293 |
| 5,223,775 | 6/1993 | Mongeau ................................ | 318/432 |
| 5,258,699 | 11/1993 | Grodevant .............................. | 318/685 |
| 5,289,098 | 2/1994 | Shinozaki ............................... | 318/696 |
| 5,303,156 | 4/1994 | Matsuoka et al. ...................... | 361/30 |
| 5,426,354 | 6/1995 | Bausch ................................... | 318/254 |
| 5,463,347 | 10/1995 | Jones et al. ............................. | 330/253 |
| 5,483,404 | 1/1996 | Nakano .................................. | 361/18 |

Primary Examiner—Vinh P. Nguyen
Attorney, Agent, or Firm—W. Daniel Swayze, Jr.; W. James Brady, III; Richard L. Donaldson

[57] ABSTRACT

A circuit is used for sensing motor current. This circuit maximizes the power delivered to the motor whose current is being sensed. Further, this circuit results in maximum voltage drop across the motor. This circuit implements a mirrored H-bridge to mirror a current flowing through a conventional H-bridge having a sensing resistor in series with a VCM motor. The voltage drop across the sensing resistor serves as an indication of the current flowing

15 Claims, 3 Drawing Sheets

MOTOR CURRENT SENSE CIRCUIT USING H BRIDGE CIRCUITS

This application is a Continuation, of application Ser. No. 08/433,236 filed on May 2. 1995, now abandoned.

BACKGROUND OF THE INVENTION

1. Field of the Invention

The present invention relates to the field of current sensing in electrical and electronics circuits. More particularly, the invention relates to current sensing in the field of electric motors, such as motors used in computer magnetic recording apparatus.

2. Background Art

The prior art has attempted to measure the current being passed through an electric motor. Specifically, the prior art has attempted to measure the current flowing through Voice Coil Motors (VCM) and Spindle Motors (SPM). Accurate measurement of the current passing through these types of electric motors has wide applicability in computer magnetic recording apparatus. For example, in disk drive applications, the VCM current must be controlled so that the VCM can accommodate the positioning of a servo head on a prescribed track. As another example in disk drive applications, the SPM current need be well controlled so that the SPM can rotate platters at a constant speed.

To fulfill the requirement of accurate control of the current passing through a VCM or a SPM, the current must be accurately sensed and then fed back to a conventional feed back system. Based on the magnitude of the feedback current, the speed of the VCM or SPM is adjusted to meet the requirements of the magnetic recording apparatus.

FIG. 1 shows a prior art circuit 10 for sensing the current passing through a VCM (i.e. motor 24 in circuit 10). An NMOS (N-type Metal-Oxide-Silicon) transistor 14 has its drain connected to Vcc 22 and its source connected to the common node of 29 which is shared between motor 24, NMOS transistor 14 and NMOS transistor 12. The drain of NMOS transistor 12 is connected to common node 29, and the source of transistor 12 is connected to ground 20. NMOS transistors 18 and 16 form a symmetrical configuration in relation to NMOS transistors 14 and 12. Transistor 18 has its drain connected to Vcc 22, while its source is connected to common node 31. Common node 31 is shared between transistors 16, 18, and sensing resistor 26. The drain of transistor 16 is connected to common node 31, and the source of transistor 16 is connected to ground 20.

Motor 24 is a VCM which has one terminal connected to common node 29 and another terminal connected to sensing resistor 26. Sensing resistor 26 is placed in series with motor 24 so that all of the current passing through motor 24 passes through sensing resistor 26. Sensing resistor 26 has one terminal connected to motor 24 and another terminal connected to common node 31. A differential amplifier 28 is connected to nodes 33 and node 31, i.e. across sensing resistor 26.

In one state of operation of circuit 10, current flows from Vcc 22 through NMOS transistor 14 and then through motor 24, sensing resistor 26, and finally through NMOS transistor 16 to ground. This current path, namely, transistor 14, motor 24, sensing resistor 26, and transistor 16 forms a first bridge. In another state of operation of circuit 10, current flows from Vcc 22 through NMOS transistor 18 and then through sensing resistor 26, motor 24, and finally through NMOS transistor 12 to ground. A second bridge is formed by this current path, namely, transistor 18, sensing resistor 26, motor 24, and transistor 12. In either state of operation of circuit 10, the current passing through motor 24 flows through sensing resistor 26, thereby developing a voltage drop across sensing resistor 26. The voltage dropped across sensing resistor 26 is amplified by differential amplifier 28. Output 32 of differential amplifier 28 is used as a feedback signal in a servo positioning system.

The prior art approach discussed above suffers from several disadvantages. First, the use of sensing resistor 26 results in loss of power intended to be delivered to motor 24. This is because the current passing through motor 24 causes a voltage drop across sensing resistor 26. The product of the voltage drop across sensing resistor 26 and the current passing through it represents a power loss in the system. Second, for low voltage disk drive applications, where the system operates on a voltage of only 3 volts, it is critical to maximize the voltage provided to motor 24. Accordingly, any voltage drop across resistor 26 is unacceptable. Third, when the resistance value of sensing resistor 26 is reduced, for example to 0.5 ohms, sensing resistor 26 becomes expensive to manufacture. Moreover, as the resistance of sensing resistor 26 is lowered, the size of resistor 26 increases, thus taking up a large area on a printed circuit board.

Therefore, there is need in the art to overcome the shortcomings of the prior art motor current sensing circuits, such as circuit 10 in FIG. 1.

SUMMARY OF THE INVENTION

The present invention discloses a circuit that overcomes the disadvantages of prior art motor current sense circuits. The invention maximizes the power delivered to the motor whose current is being sensed. Further, the invention results in maximum voltage drop across the motor. The invention overcomes the prior art need to manufacture sensing resistors with ultra-small values. The invention also overcomes the prior art need to use external sensing resistors. This results in savings of area on printed circuit boards and also a reduction in the cost of manufacturing resistors with ultra-low resistivity.

The invention achieves the above results by mirroring the motor current onto a mirrored bridge. The current that flows through the mirrored bridge is a small fraction (for example, 0.1%) of the motor current. This reduction in current allows the value of the sensing resistor across the mirrored bridge to be reasonable. The value. of the sensing resistor is such that a) it is easily implemented in an integrated circuit, and b) its absolute tolerance with process variations is insignificant since it (the sensing resistor) is made to match a feedback resistor in order to cancel the effects of process variations. Accordingly, the prior art requirement that the sensing resistor be in series with the motor is overcome.

DETAILED DESCRIPTION OF THE PRESENT INVENTION

A precision motor current sense circuit is described. In the following description, numerous specific details are set forth in order to provide a more thorough understanding of the present invention. It will be apparent, however, to one skilled in the art, that the present invention may be practiced without these specific details. In other instances, well known features have not been described in detail so as not to obscure the present invention.

Figure 1:
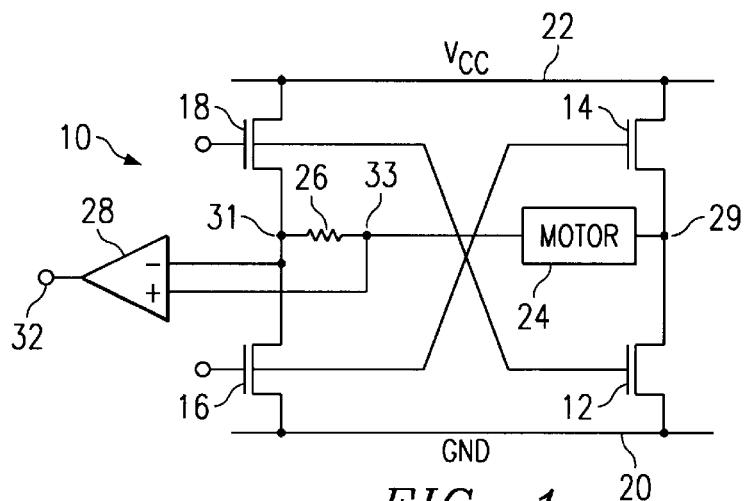
FIG. 1 shows a prior art motor current sense circuit.
Figure 2:
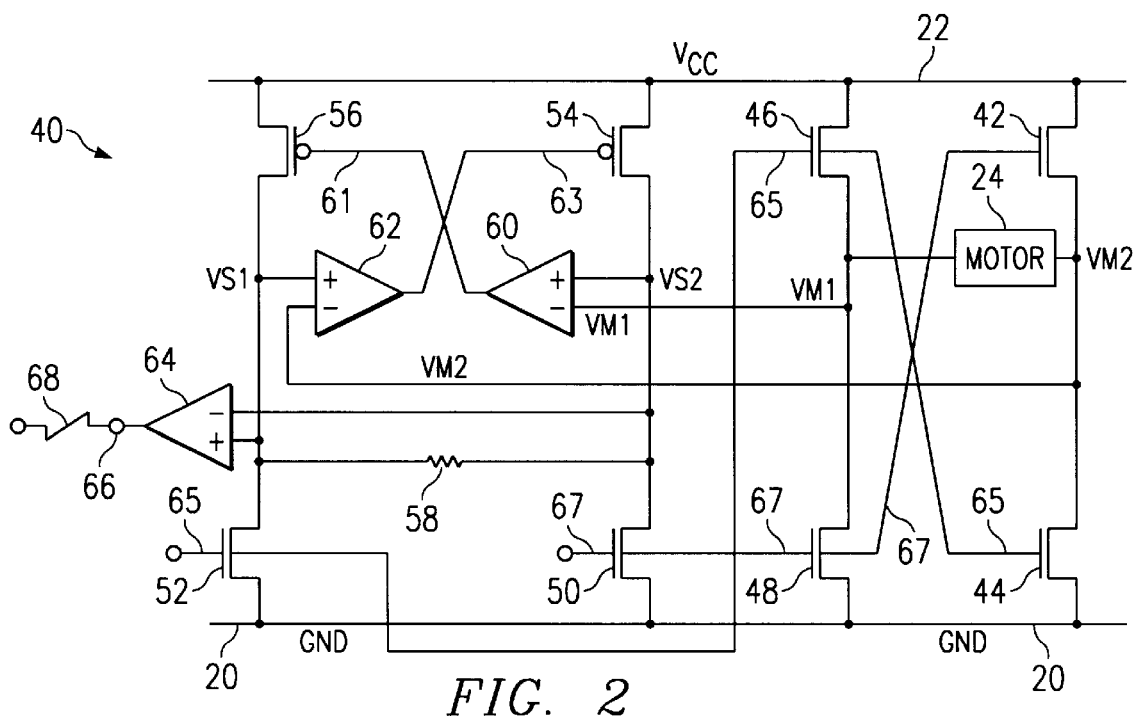
FIG. 2 shows an embodiment of a current sense circuit according to the present invention.

FIG. 2 shows an embodiment of the precision motor current sense circuit 40 of the present invention. In this embodiment, all transistors are Ntype MOS transistors, except for PMOS transistors 54 and 56. Transistors 42, 44, 46, and 48 form an "H-bridge" (also referred to as a "first stage" in the present application) to provide a current through a VCM 24 of circuit 40, while transistors 50, 52, 54, 56, sensing resistor 58, and amplifiers 60, 62, and 64 form a "mirrored H-bridge" (also referred to as a "second stage" in the present application) of circuit 40.

Turning attention to the H-bridge of circuit 40, the drain of NMOS transistor 42 is connected to Vcc 22, and the source is connected to node VM2. Vcc 22 is connected to external power supply through appropriate pins of the IC package that houses the invention's current sense circuit 40. Node VM2 is a common node shared between transistor 42, a first terminal of motor 24, and transistor 44. NMOS transistor 44 has its drain connected to node VM2 and its source connected to ground 20. Ground 20 is connected to external ground (not shown) through appropriate pins of the IC package. The drain of NMOS transistor 46 is connected to Vcc 22, and its source is connected to common node VM1. Node VM1 is shared between the source of transistor 46, a second terminal of motor 24, and the drain of NMOS transistor 48. The source of transistor 48 is connected to ground 20. Motor 24 has one terminal connected to VM2 and another terminal connected to VM1.

Turning attention to the mirrored H-bridge of circuit 40, P-type MOS transistor 54 has its source connected to Vcc 22, and its drain connected to node VS2. Node VS2 is a common node shared between the drain of transistor 54, the positive terminal of differential amplifier 60, the negative terminal of differential amplifier 64, a first terminal of sensing resistor 58, and the drain of NMOS transistor 50. Transistor 50 has its drain connected to common node VS2, and its source connected to ground 20. The source of PMOS transistor 56 is connected to Vcc 22, and the drain of transistor 56 is connected to node VS1. Node VS1 is a common node shared between the drain of transistor 56, the positive terminal of differential amplifier 62, the positive terminal of differential amplifier 64, a second terminal of sensing resistor 58, and the drain of NMOS transistor 52. Transistor 52 has its drain connected to common node VS1, and its source connected to ground 20.

Sensing resistor 58 has one terminal connected to common node VS1, and another terminal connected to common node VS2. Differential amplifier 60 has its positive terminal connected to common node VS2, while its negative terminal is connected to common node VM1 of the H-bridge of circuit 40. Differential amplifier 62 has its positive terminal connected to common node VS1, while its negative terminal is connected to common node VM2 of the H-bridge. The output of differential amplifier 60 is connected to gate 61 of PMOS transistor 56, while the output of differential amplifier 62 is connected to gate 63 of PMOS transistor 54. Differential amplifier 64 has its positive terminal connected to common node VS1, and its negative terminal connected to common node VS2. NMOS transistors 52, 46, and 44 share a common gate 65, while NMOS transistors 50, 48, and 42 share a common gate 67. Output 66 of differential amplifier 64 is connected to feedback resistor 68. Feedback resistor 68 is in turn coupled to an error amplifier (not shown) which is coupled to motor 24.

In a first state of the operation of current sense circuit 40, a current path is formed by the current flowing from Vcc 22 to transistor 42, through motor 24 and transistor 48 to ground. This current path forms a first bridge in the H-bridge of circuit 40. In a second state of the operation of circuit 40, a second current path is formed by the current flowing from Vcc 22 to transistor 46, through motor 24, and finally through transistor 44 to ground. This current path forms a second bridge in the H-bridge of circuit 40.

In the first state of the operation of current sense circuit 40, the current passing through the first bridge of the H-bridge, namely, the current passing through transistors 42 and 48 is "mirrored" by transistor 50 of the mirrored H-bridge of circuit 40. In the second state of the operation of current sense circuit 40, the current passing through the second bridge of the H-bridge, namely, the current flowing through transistors 46 and 44 is "mirrored" by transistor 52 of the second stage of circuit 40.

In order for transistor 50 to accurately mirror the current in the first bridge of the H-bridge, two conditions must be met. First, the gate voltage of transistor 50 must be equal to the gate voltage of transistors 42 and 48. In circuit 40 this is accomplished because transistors 50, 42, and 48 share a common gate. The second condition is that the drain voltage of transistor 50 (i.e. the voltage at node VS2) must be equal to the drain voltage of transistor 48 (i.e. the voltage at node VM1). If this second condition is met, and assuming that transistor 50 has the same size as transistor 48, the current flowing through transistors 50 and 48 will be equal. Accordingly, the current flowing through transistor 50 will be equal to the current flowing through the first bridge of the H-bridge of circuit 40.

To meet the second condition, a high gain differential amplifier 60 is used with voltages VS2 and VM1 as inputs to its positive and negative terminals, respectively. High gain differential amplifier 60 forces the voltages at nodes VM1 and VS2 to be equal. When, the voltage at node VS2 is higher than the voltage at node VM1, the. output of differential amplifier 60 transitions high. This causes an increase in the voltage of gate 61 of PMOS transistor 56. Since the gate to source voltage of transistor 56 is reduced, the current flowing through transistor 56 is proportionately decreased. Accordingly, the current flowing from Vcc 22 through the current path formed by transistor 56, sensing resistor 58, and transistor 50 decreases. In other words, the path from node VS2 to Vcc 22 becomes more resistive. It follows that the voltage at node VS2 is forced closer to ground voltage. This reduction of the voltage at node VS2 is continued until the voltages at nodes VM1 and VS2 become equal. In a similar manner, when the voltage at node VS2 is less than the voltage at node VM1, the voltage at node VS2 is forced higher until the voltages at nodes VM1 and VS2 become equal. Thus, transistor 50 forces the current in the current path formed by transistor 56, sensing resistor 58, and transistor 50 to be equal to the current in the first bridge of the H-bridge. The path formed by transistor 56, sensing resistor 58, and transistor 50 comprises a first bridge of the mirrored H-bridge of circuit 40.

With respect to the second state of the operation of circuit 40, transistor 52 must mirror the current passed through transistors 46 and 44 which comprise the second bridge of the H-bridge of circuit 40. For transistor 52 to accurately mirror this current, two conditions must be met First, the gate voltage of transistor 52 must be equal to the gate voltage of transistors 46 and 44. In circuit 40 this is accomplished because transistors 52, 46, and 44 share a common gate.

The second condition is that the drain voltage of transistor 52 (i.e. the voltage at node VS1) must be equal to the drain voltage of transistor 44 (i.e. the voltage at node VM2). If this conditions is met, and assuming that transistor 52 has the same size as transistor 44, the current flowing through transistors 52 and 44 will be equal. Accordingly, the current flowing through transistor 52 will be equal to the current flowing through the second bridge of the H-bridge of circuit 40. To meet the second condition, a high gain differential amplifier 62 is used with voltages VS1 and VM2 as inputs to its positive and negative terminals, respectively. High gain differential amplifier 62 forces the voltages at nodes VM2 and VS1 to be equal. When, the voltage at node VS1 is higher than the voltage at node VM2, the output of differential amplifier 62 transitions high. This causes an increase in the voltage of gate 63 of PMOS transistor 54.1 Since the gate to source voltage of transistor 54 is reduced, the current flowing through transistor 54 is proportionately decreased. Accordingly, the current flowing from Vcc 22 through the current path formed by transistor 54, sensing resistor 58, and transistor 52 decreases. In other words, the path from node VS1 to Vcc 22 becomes more resistive. It follows that the voltage at node VS1 is forced closer to ground voltage. This reduction of the voltage at node VS1 is continued until the voltages at nodes VM2 and VS1 become equal. In a similar manner, when the voltage at node VS1 is less than the voltage at node VM2, the voltage at node VS1 is forced higher until the voltages at nodes VM2 and VS1 become equal. Thus, transistor 52 forces the current in the current path formed by transistor 54, sensing resistor 58, and transistor 52 to be equal to the current in the second bridge of the H-bridge. The path formed by transistor 54, sensing resistor 58, and transistor 52 comprises a second bridge of the mirrored H-bridge of circuit 40.

According to an embodiment of the invention, transistors 50 and 52 are scaled down versions of transistors 48 and 44, respectively. For example, transistors 50 and 52 can be few hundred times smaller than transistors 48 and 44, respectively. Thus, the current mirrored into the first bridge of the mirrored H-bridge is a few hundred times smaller than the current flowing in the first bridge of the H-bridge. Likewise, the current mirrored into the second bridge of the mirrored H-bridge is a few hundred times smaller than the current flowing in the second bridge of the H-bridge. Accordingly, sensing resistor 58 can also be a few hundred times larger than the prior art sensing resistors. Differential amplifier 64 is a means for measuring the voltage across sensing resistor 58. Output 66 of differential amplifier 64 is an indication of the voltage difference between nodes VS1 and VS2, and hence an indication of the current flowing through sensing resistor 58. Output 66 is connected to feedback resistor 68, thus the voltage at output 66 causes a current to flow through the feedback resistor 68. Accordingly, the current through feedback resistor 68 tracks the current flowing through sensing resistor 58. Feedback resistor 68 and sensing resistor 58 are fabricated by the same material and process steps so that process variations affect both resistors in the same manner. Thus, the current flow through feedback resistor 68 tracks the current flow through sensing resistor 58 regardless of process variations. The current through feedback resistor 68 is eventually fed to an error amplifier (not shown in the Figures). The error amplifier compares the current through feedback resistor 68 to a VCM command current (i.e. the desired operating current of motor 24). Thus, knowing the current flowing through motor 24 (by knowing the current through feedback resistor 68), the current through motor 24 is adjusted in order to match the desired operating current.

Figure 3A:
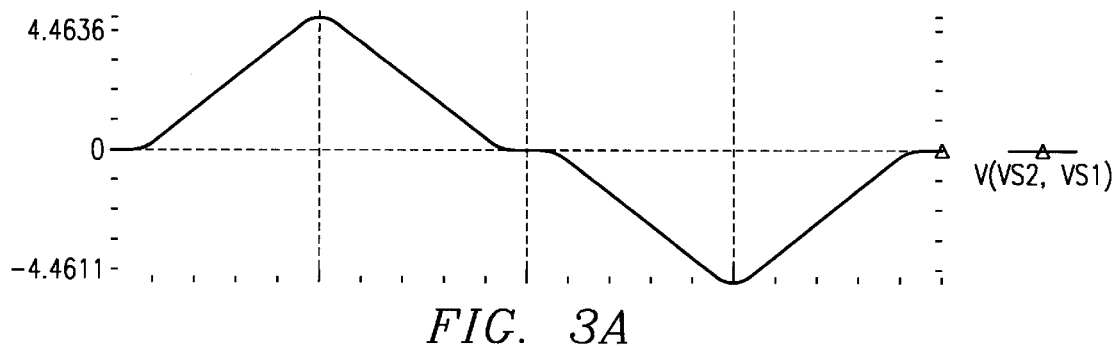
FIGS. 3A through 3D show computer simulation results illustrating the operation of the embodiment of the present invention shown in FIG. 2.
Figure 3B:
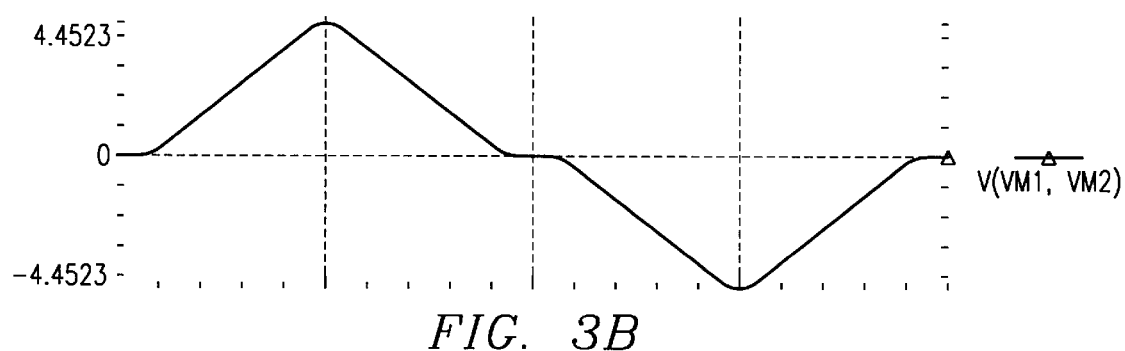

FIGS. 3A through 3D show results of computer simulation for the embodiment of the invention discussed above. In these computer simulations, motor 24 is modeled by a constant resistor. Although, the simulation model used for a motor, for example a VCM, is typically an inductor in series with a resistor, in steady state conditions the inductor acts substantially as a short circuit. Accordingly, a single invariable resistor was used to accurately model motor 24 in the computer simulations that resulted in the waveforms shown in FIGS. 3A through 3D. FIG. 3A shows the waveform representing the voltage difference between VS1 and VS2 (i.e. the voltage across sensing resistor 58). FIG. 3B shows the waveform representing the voltage difference between VM1 and VM2 (i.e. the voltage across motor 24). As shown in FIGS. 3A and 3B, the voltage across sensing resistor 58 closely and accurately tracks the voltage across motor 24.

Figure 3C:
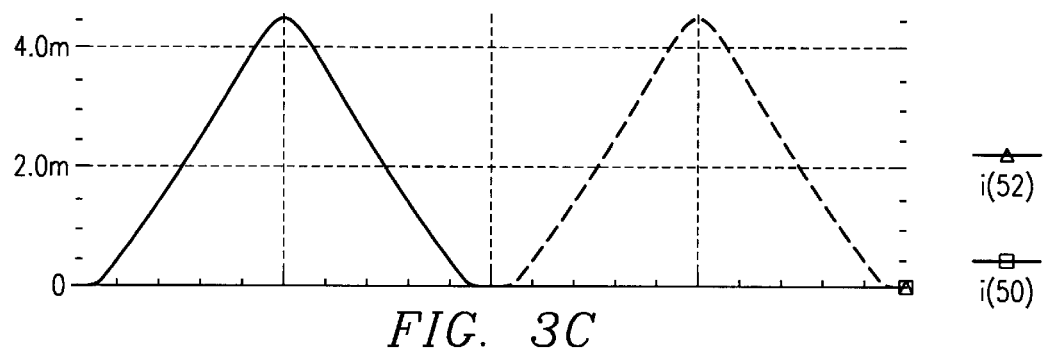
Figure 3D:
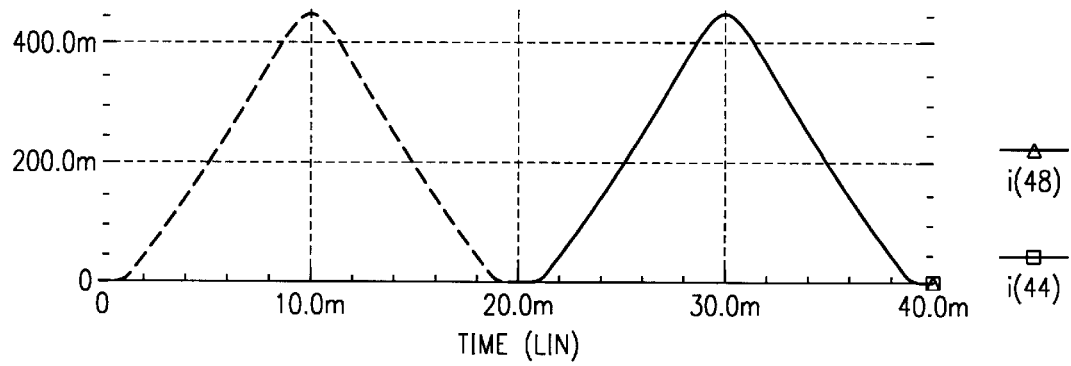

FIG. 3C shows the waveform representing the current passing through the first bridge of stage 2, namely i(50), and the second bridge of the second stage, namely i(52). As shown, these currents alternate during the first and second states of the operation of circuit 40 of the invention. FIG. 3D shows the waveform representing the current passing through the first bridge of the first stage, namely. i(48), and the current passing through the second bridge of the first stage, namely i(44). As shown in FIGS. 3C and 3D, the currents in the first bridges of the first stage and the second stage closely track each other, except that the current mirrored into the second stage is one hundred times smaller than the current in the first stage. Likewise, the currents in the second bridges of the first stage and the second stage closely track each other, except that the current mirrored into the second stage is one hundred times smaller than the current in the first stage.

Figure 4:
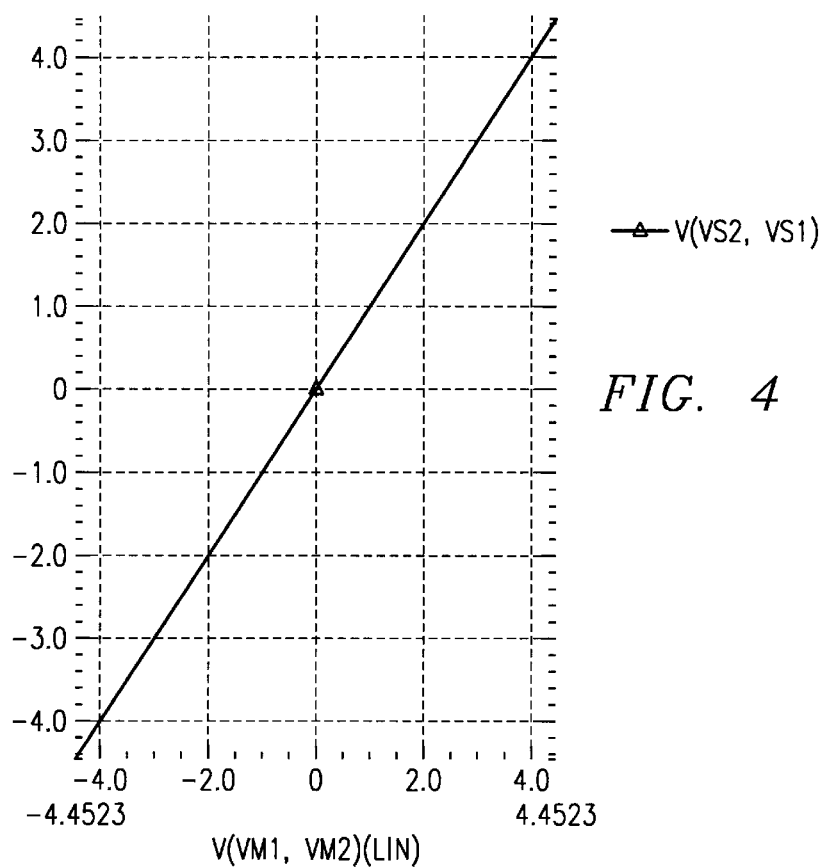
FIG. 4 shows computer simulation results further illustrating the operation of the embodiment of the present invention shown in FIG. 2.

FIG. 4 shows the voltage difference between VM1 and VM2 (i.e. the voltage across motor 24) on the x-axis, and the voltage difference between VS1 and VS2 (i.e. the voltage across sensing resistor 58) on the y-axis. As shown in FIG. 4, with appropriate values for sensing resistor 58, the voltage across sensing resistor 58 accurately and closely tracks the voltage across motor 24. It follows that the current flowing through sensing resistor 58 also accurately tracks the current flowing through motor 24.

Figure 5:
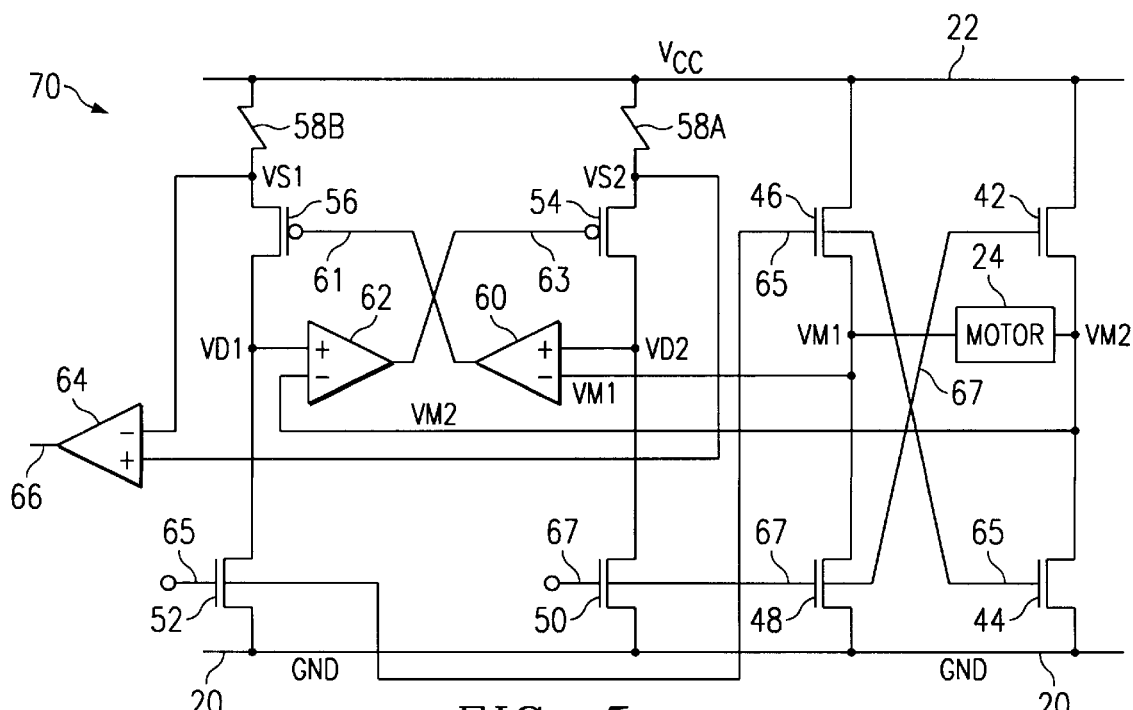
FIG. 5 shows another embodiment of a current sense circuit according to the present invention.

FIG. 5 shows another embodiment of the present invention. In this embodiment, sensing resistor 58 of FIG. 2 is removed from across nodes VS1 and VS2. Instead, sensing resistors 58A and 58B, each of which have the same resistance as sensing resistor 58 of FIG. 2, are placed in series with transistors 54 and 56, respectively. This embodiment of the invention works similarly to the embodiment of FIG. 2. In this embodiment, the voltage difference between nodes VS1 and VS2 is an indication of the current flowing through sensing resistors 58A and 58B. Output 66 of differential amplifier 64 amplifies the difference between voltages VS1 and VS2. Output 66 is an indication of the current flowing through sensing resistors 58A, during the first state of the operation of circuit 70 of FIG. 5. Likewise, output 66 is an indication of the current flowing through sensing resistor 58B, during the second state of the operation of circuit 70 of FIG. 5. One advantage of this embodiment is that the fluctuations of voltage at the inputs of differential amplifier 60 are referenced with respect to VCC 22 which is fixed voltage. Accordingly, the design of differential amplifiers 60 and 62 for small signal operation is relatively easy because of the improvement in the common mode range of the amplifiers.

The present invention overcomes the prior art problems that resulted from placing a sensing resistor in series with the motor. As stated above, sensing resistor 58 of the embodiment of FIG. 2 (or sensing resistors 58A and 58B of the embodiment of FIG. 5) can be a few hundred times larger than the prior art sensing resistor. Thus, the sensing resistor of the invention has a much more reasonable value than the ultra-small sensing resistor of the prior art. Accordingly, the sensing resistor of the invention presents a significant reduction in cost over the sensing resistor of the prior art. Further, the sensing resistor of the invention consumes a smaller silicon area, and can in fact be implemented in an IC. Moreover, the various embodiments of the invention do not take power away from the motor whose current is being measured. Also, the invention does not result in a loss of voltage available to the motor. This advantage of the invention is particularly valuable in low voltage disk drive applications.

Although the invention has been described with reference to specific embodiments, it is appreciated by those skilled in the art that changes in various details may be made without departing from the invention defined in the appended claims. For example, the MOS transistors can be replaced by bipolar or other types of transistors. Further, N-type MOS transistors may be replaced by P-type MOS transistors with appropriate changes in voltage polarities. As another example, the present invention can be applied to sense the current in any kind of an electric motor, including VCM's and SPM's.

Thus, a precision motor current sense circuit has been described.

I claim:

1. A circuit for sensing current in a motor, said circuit comprising:
   a first H bridge circuit having a first arm and a second arm, said first H bridge, circuit supplying power to said motor, said power causing a motor current to flow through said motor and said motor being connected between said first arm and said second arm;
   a second H bridge circuit having a third arm and a fourth arm and supplying power to a sensing resistor, said second H bridge circuit mirroring a current proportional to said motor current into said sensing resistor wherein said sensing resistor is connected between said third arm and said fourth arm; and
   a circuit for measuring a voltage across said sensing resistor, wherein said voltage across said sensing resistor is proportional to said motor current.

2. The circuit of claim 1 wherein said first H bridge circuit comprises a first current path including a first transistor coupled to a power supply in series with said motor and in series with a second transistor coupled to ground, wherein during a first state of operation of said circuit current flows from said power supply to ground through said first current path.

3. The circuit of claim 2 wherein said first H bridge circuit further comprises a second current path including a third transistor coupled to said power supply in series with said motor and in series with a fourth transistor coupled to ground, wherein during a second state of operation of said circuit current flows from said power supply to ground through said second current path.

4. The circuit of claim 1 wherein said second H bridge circuit comprises a first current path including a first transistor coupled to a power supply in series with said sensing resistor and in series with a second transistor coupled to ground, wherein during a first state of operation of said circuit, a current substantially equal to said motor current is forced through said sensing resistor.

5. The circuit of claim 4 wherein said second H bridge circuit comprises a second current path including a third transistor coupled to a power supply in series with said sensing resistor and in series with a fourth transistor coupled to ground, wherein during a second state of operation of said circuit, a current substantially equal to said motor current is forced through said sensing resistor.

6. A circuit for sensing current in a motor, said circuit comprising:
   a first bridge circuit having a first arm and a second arm, said first bridge circuit supplying power to said motor, said power causing a motor current to flow through said motor and said motor being connected between said first arm and said second arm;
   a second bridge circuit having a third arm and a fourth arm and supplying power to a sensing resistor, said second bridge circuit mirroring a current proportional to said motor current into said sensing resistor wherein said sensing resistor is connected between said third arm and said fourth arm; and
   a circuit for measuring a voltage across said sensing resistor, wherein said voltage across said sensing resistor is proportional to said motor current; and,
   wherein said first bridge circuit comprises a first current path including a first transistor coupled to a power supply in series with said motor and in series with a second transistor coupled to ground, wherein during a first state of operation of said circuit current flows from said power supply to ground through said first current path; and,
   wherein said first bridge circuit further comprises a second current path including a third transistor coupled to said power supply in series with said motor and in series with a fourth transistor coupled to ground, wherein during a second state of operation of said circuit current flows from said power supply to ground through said second current path,
   wherein said second bridge circuit comprises a first current path including a fifth transistor coupled to said power supply in series with said sensing resistor and in series with a sixth transistor coupled to ground, wherein during said first state of operation of said circuit, a current substantially equal to said motor current is forced through said sensing resistor.

7. The circuit of claim 6 wherein said second bridge circuit comprises a second current path including a seventh transistor coupled to said power supply in series with said sensing resistor and in series with an eighth transistor coupled to ground, wherein during said second state of operation of said circuit, a current substantially equal to said motor current is forced through said sensing resistor.

8. The circuit of claim 7 wherein a positive terminal of a differential amplifier is coupled to a drain of said eighth transistor, and a negative terminal of said differential amplifier is coupled to a drain of said fourth transistor, said differential amplifier causing a voltage of said drain of said eighth transistor to be substantially equal to a voltage of said drain of said fourth transistor.

9. The circuit of claim 8 wherein said third, fourth, and eighth transistors have common gates.

10. The circuit of claim 6 wherein a positive terminal of a differential amplifier is coupled to a drain of said sixth transistor, and a negative terminal of said differential amplifier is coupled to a, drain of said second transistor, said differential amplifier causing a voltage of said drain of said sixth transistor to be substantially equal to a voltage of said drain of said second transistor.

11. The circuit of claim 10 wherein said first, second, and sixth transistors have common gates.

12. A circuit for sensing current in a motor, said circuit comprising:

a first stage, said first stage supplying power to said motor, said power causing a motor current to flow through said motor;

a second stage supplying power to a sensing resistor, said second stage mirroring a current proportional to said motor current into said sensing resistor; and a circuit for measuring a voltage across said sensing resistor, wherein said voltage across said sensing resistor is proportional to said motor current;

said first stage comprising a first current path including a first transistor coupled to a power supply in series with said motor and in series with a second transistor coupled to ground, wherein during a first state of operation of said circuit current flows from said power supply to ground through said first current path;

said first-stage further comprising a second current path including a third transistor coupled to said power supply in series with said motor and in series with a fourth transistor coupled to ground, wherein during a second state of operation of said circuit current flows from said power supply to ground through said second current path;

said second stage comprising a first current path including a fifth transistor coupled to said power supply in series with said sensing resistor and in series with a sixth transistor coupled to ground, wherein during said first state of operation of said circuit, a current substantially-equal to said motor current is forced through said sensing resistor;

wherein a positive terminal of a differential amplifier is coupled to a drain of said sixth transistor, and a negative terminal of said differential amplifier is coupled to a drain of said second transistor, said differential amplifier causing a voltage of said drain of said sixth transistor to be substantially equal to a voltage of said drain of said second transistor.

13. The circuit of claim 12 wherein said first, second, and sixth transistors have common gates.

14. A circuit for sensing current in a motor, said circuit comprising:

a first stage, said first stage supplying power to said motor, said power causing a motor current to flow through said motor;

a second stage supplying power to a sensing resistor, said second stage mirroring a current proportional to said motor current into said sensing resistor; and a circuit for measuring a voltage across said sensing resistor, wherein said voltage across said sensing resistor is proportional to said motor current;

said first stage comprising a first current path including a first transistor coupled to a power supply in series with said motor and in series with a second transistor coupled to ground, wherein during a first state of operation of said circuit current flows from said power supply to ground through said first current path;

said first stage further comprising a second current path including a third transistor coupled to said power supply in series with said motor and in series with a fourth transistor coupled to ground, wherein during a second state of operation of said circuit current flows from said power supply to ground through said second current path;

said second stage comprising a first current path including a fifth transistor coupled to said power supply In series with said sensing resistor and in series with a sixth transistor coupled to ground, wherein during said first state of operation of said circuit, a current substantially equal to said motor current is forced through said sensing resistor;

wherein said second stage comprises a second current path including a seventh transistor coupled to said power supply in series with said sensing resistor and in series with an eighth transistor coupled to ground, wherein during said second state of operation of said circuit, a current substantially equal to said motor current is forced through said sensing resistor;

wherein a positive terminal of a differential amplifier is coupled to a drain of said eighth transistor, and a negative terminal of said differential amplifier is coupled to a drain of said fourth transistor, said differential amplifier causing a voltage of said drain of said eighth transistor to be substantially equal to a voltage of said drain of said fourth transistor.

15. The circuit of claim 14 wherein said third, fourth, and eighth transistors have common gates.

* * * * *